United States Patent
Deford

(10) Patent No.: US 11,936,301 B2
(45) Date of Patent: *Mar. 19, 2024

(54) DUAL FEEDBACK LOOP FOR PRECISION HIGH VOLTAGE POWER SUPPLY

(71) Applicant: AGILENT TECHNOLOGIES, INC., Santa Clara, CA (US)

(72) Inventor: David Deford, Pleasanton, CA (US)

(73) Assignee: AGILENT TECHNOLOGIES, INC., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/069,062

(22) Filed: Dec. 20, 2022

(65) Prior Publication Data
US 2023/0127124 A1 Apr. 27, 2023

Related U.S. Application Data

(63) Continuation of application No. 17/242,077, filed on Apr. 27, 2021, now Pat. No. 11,557,974.

(60) Provisional application No. 63/038,588, filed on Jun. 12, 2020.

(51) Int. Cl.
*H02M 3/335* (2006.01)
*H02M 1/00* (2006.01)

(52) U.S. Cl.
CPC ..... *H02M 3/33515* (2013.01); *H02M 1/0003* (2021.05); *H02M 1/0025* (2021.05)

(58) Field of Classification Search
CPC ........... H02M 3/33515; H02M 1/0003; H02M 1/0025; H03M 1/68
See application file for complete search history.

(56) References Cited

U.S. PATENT DOCUMENTS

| 5,530,636 A | 6/1996 | Brown |
| 8,860,595 B1 * | 10/2014 | Fan ......................... H02M 7/02 323/298 |
| 10,872,753 B2 | 12/2020 | Deford |
| 11,557,974 B2 * | 1/2023 | Deford ................ H02M 1/0025 |

(Continued)

FOREIGN PATENT DOCUMENTS

JP 2015100235 A 5/2015

OTHER PUBLICATIONS

PCT Notification of Transmittal of The International Search Report & Written Opinion dated Aug. 13, 2021 for Application No. PCT/US2021/029466; 9 pages.

*Primary Examiner* — Kyle J Moody
(74) *Attorney, Agent, or Firm* — Mannava & Kang, P.C.

(57) ABSTRACT

A high-voltage (HV) power supply outputs an output voltage based on a control signal produced by a dual analog/digital feedback loop. The control signal is determined at least in part by an error amplifier that receives a measurement signal, proportionally attenuated from the output voltage, and a digital-to-analog converter (DAC) output signal. An analog-to-digital converter (ADC) also receives the measurement signal and transmits it in digitized form to a digital processor. The digital processor calculates a digital DAC data signal based on the measurement signal, and on a digital set-point input signal corresponding to a set-point voltage value of the output voltage desired to be outputted from the high-voltage source. A DAC receives the DAC data signal and converts it to the DAC output signal transmitted to the error amplifier.

20 Claims, 5 Drawing Sheets

(56) References Cited

U.S. PATENT DOCUMENTS

| | | |
|---|---|---|
| 2005/0010826 A1 | 1/2005 | Pullen et al. |
| 2006/0086891 A1 | 4/2006 | Gottesman et al. |
| 2018/0284823 A1 | 10/2018 | Na et al. |
| 2020/0035473 A1 | 1/2020 | Deford |

* cited by examiner

DUAL FEEDBACK LOOP FOR PRECISION HIGH VOLTAGE POWER SUPPLY

RELATED APPLICATIONS

This application is a Continuation of commonly assigned and co-pending U.S. patent application Ser. No. 17/242,077, filed Apr. 27, 2021, which claims the benefit under 35 U.S.C. § 119(e) of U.S. Provisional Patent Application Ser. No. 63/038,588, filed Jun. 12, 2020, titled "DUAL FEEDBACK LOOP FOR PRECISION HIGH VOLTAGE POWER SUPPLY," the entire contents of which are incorporated by reference herein.

TECHNICAL FIELD

The present invention generally relates to a high-voltage power supply for use in instruments requiring precision high-voltage power, e.g., mass spectrometers and electron microscopes. In particular, the invention relates to a high-voltage power supply featuring a dual feedback loop for controlling the power outputted by the power supply.

BACKGROUND

A high-voltage (HV) power supply, for example outputting a DC voltage in a magnitude range 1 kV or greater, requires a feedback control loop to enable the power supply to output the high voltage with a desired level of precision, i.e. output the voltage at a magnitude that is within an acceptable tolerance range of the desired set-point voltage. In the typical configuration, the HV power supply senses the output voltage and feeds it back to control the operation of the HV power supply through either an analog or a digital loop to achieve low frequency noise and drift of several parts per million (ppm).

The typical HV power supply utilizes a variety of components in its feedback control loop that introduce noise and drift in the output voltage. Many such components are needed to implement the power supply, making it difficult to keep their total degrading effect on the output voltage low enough to achieve the desired level of precision. The performance of certain instruments, such as time-of-flight (TOF) mass spectrometers and electron microscopes, is degraded by the noise and drift of their internal HV power supplies.

There is an ongoing need to provide an HV power supply capable of reliably supplying an output voltage at a desired level with high precision.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

A high-voltage (HV) power supply that outputs an output voltage with high precision is disclosed herein. The output voltage is determined or controlled by a control signal provided to a high-voltage source by a dual analog/digital feedback loop. The control signal is determined at least in part by an error amplifier that receives a measurement signal, proportionally attenuated from the output voltage, and a digital-to-analog converter (DAC) output signal. An analog-to-digital converter (ADC) also receives the measurement signal and transmits it in digitized form to a digital processor. The digital processor calculates a digital DAC data signal based on the measurement signal, and on a digital set-point input signal corresponding to a set-point voltage value of the output voltage desired to be outputted from the high-voltage source. A DAC receives the DAC data signal and converts it to the DAC output signal that is transmitted to the error amplifier. In an embodiment, the addition of the ADC to realize a digital feedback loop improves the precision of the HV power supply without introducing significant additional errors (e.g., noise, drift, etc.).

According to one embodiment, a high-voltage (HV) power supply includes: a high-voltage output; a high-voltage source comprising a control signal input, and configured to output an output voltage at the high-voltage output based on a control signal received at the control signal input; a voltage divider configured to produce a measurement signal proportionally attenuated from the output voltage; an error amplifier comprising a feedback input, a setting input, and an amplifier output, wherein the error amplifier is configured to receive the measurement signal from the voltage divider at the feedback input, receive a digital-to-analog converter (DAC) output signal at the setting input, produce the control signal based on the measurement voltage signal and the DAC output signal, and output the control signal from the amplifier output to the control signal input; an analog-to-digital converter (ADC) configured to receive the measurement signal from the voltage divider, convert the measurement signal to an ADC data signal, and output the ADC data signal; a digital processor configured to receive the ADC data signal from the ADC, receive a digital set-point input signal, and produce a digital DAC data signal based on the ADC data signal and the digital set-point input signal, wherein the digital set-point input signal corresponds to a set-point voltage value of the output voltage desired to be outputted at the high-voltage output; and a digital-to-analog converter (DAC) configured to receive the digital DAC data signal from the digital processor, convert the digital DAC data signal to an analog DAC output signal, and output the DAC output signal to the setting input, wherein the digital processor is configured to calculate a value for the digital DAC data signal effective to set the control signal outputted by the error amplifier to a value effective for adjusting the output voltage outputted by the high-voltage source to the set-point voltage value.

According to another embodiment, a high-voltage (HV) power supply includes: a high-voltage output; a high-voltage source comprising a control signal input, and a return side communicating with the high-voltage output, wherein the high-voltage source is configured to output an output voltage as measured from the return side to the high-voltage output based on a control signal received at the control signal input and an amplifier output signal received at the return side; a voltage divider configured to produce a measurement signal proportionally attenuated from the output voltage; an error amplifier comprising a feedback input, a setting input, and an amplifier output, wherein the error amplifier is configured to receive the measurement signal from the voltage divider at the feedback input, receive a digital-to-analog converter (DAC) output signal at the setting input, produce the amplifier output signal based on the measurement signal and the DAC output signal, and output the amplifier output signal from the amplifier output to the return side; an analog-to-digital converter (ADC) configured to receive the measurement signal from the voltage divider, convert the measurement signal to an ADC data signal, and output the ADC data signal; a digital processor configured to receive the ADC data signal from the ADC, receive the amplifier output signal from the error amplifier, receive a digital set-point input signal, and produce a first digital DAC data signal and a second digital DAC data signal based on the ADC data signal, the amplifier output signal, and the digital set-point input signal, wherein the digital set-point input signal corresponds to a set-point voltage value of the output voltage desired to be outputted at the high-voltage output; a first digital-to-analog converter (DAC) configured to receive the first digital DAC data signal from the digital processor, convert the first digital DAC data signal to an analog DAC output signal, and output the DAC output signal to the setting input; a second DAC configured to receive the second digital DAC data signal from the digital processor, convert the second digital DAC data signal to the control signal, and output the control signal to the control signal input, wherein the digital processor is configured to calculate respective values for the first digital DAC data signal and the second digital DAC data signal effective to set the amplifier output signal to a value effective for adjusting the output voltage outputted by the high-voltage source to the digital voltage set-point inputted to the set-point voltage value.

According to another embodiment, a charged particle processing apparatus includes: an HV power supply according to any of the embodiments disclosed herein; and a charged particle processing device comprising an electrode and a chamber for containing charged particles, wherein the charged particle processing device is configured to apply the high voltage outputted by the HV power supply to the electrode to generate an electric field to which the charged particles in the chamber are exposed.

According to another embodiment, a method for supplying a high voltage includes: outputting an output voltage from a high-voltage source based on a control signal received by the high-voltage source; producing a measurement signal proportionally attenuated from the output voltage; transmitting the measurement signal to a feedback input of an error amplifier, and to an analog-to-digital converter (ADC); and in the ADC, converting the measurement signal to an ADC data signal, and transmitting the ADC data signal to a digital processor. The method further includes: in the digital processor, receiving a digital set-point input signal corresponding to a set-point voltage value of the output voltage desired to be outputted from the high-voltage source, producing a digital DAC data signal based on the ADC data signal and the digital set-point input signal, and transmitting the digital DAC data signal to a digital-to-analog converter (DAC). The method further includes: in the DAC, converting the digital DAC data signal to an analog DAC output signal, and transmitting the DAC output signal to a setting input of the error amplifier; and in the error amplifier, producing the control signal based on the measurement signal and the analog DAC output signal, and transmitting the control signal to the high-voltage source. According to the method, the digital processor calculates a value for the digital DAC data signal effective to set the control signal produced by the error amplifier to a value effective for adjusting the output voltage outputted by the high-voltage source to the set-point voltage value.

According to another embodiment, a method for supplying a high voltage includes: outputting an output voltage from a high-voltage source based on a control signal received by the high-voltage source; producing a measurement signal proportionally attenuated from the output voltage; transmitting the measurement signal to a feedback input of an error amplifier, and to an analog-to-digital converter (ADC); and in the ADC, converting the measurement signal to an ADC data signal, and transmitting the ADC data signal to a digital processor. The method further includes: in the digital processor: receiving a digital set-point input signal corresponding to a set-point voltage value of the output voltage desired to be outputted from the high-voltage source; receiving an amplifier output signal from the error amplifier; producing a first digital DAC data signal and a second digital DAC data signal based on the ADC data signal, the digital set-point input signal, and the amplifier output signal; transmitting the first digital DAC data signal to a first digital-to-analog converter (DAC); and transmitting the second digital DAC data signal to a second digital-to-analog converter (DAC). The method further includes: in the first DAC, converting the first digital DAC data signal to an analog DAC output signal, and transmitting the DAC output signal to a setting input of the error amplifier; in the error amplifier, producing the amplifier output signal based on the measurement signal and the analog DAC output signal; and in the second DAC, converting the second digital DAC data signal to the control signal, and transmitting the control signal to the high-voltage source. According to the method, the digital processor calculates respective values for the first digital DAC data signal and the second digital DAC data signal effective to set the amplifier output signal to a value effective for adjusting the output voltage outputted by the high-voltage source to the digital voltage set-point inputted to the set-point voltage value.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

As used herein, the term "high voltage" refers generally to a voltage in a range from 1 kV or greater.

Figure 1:
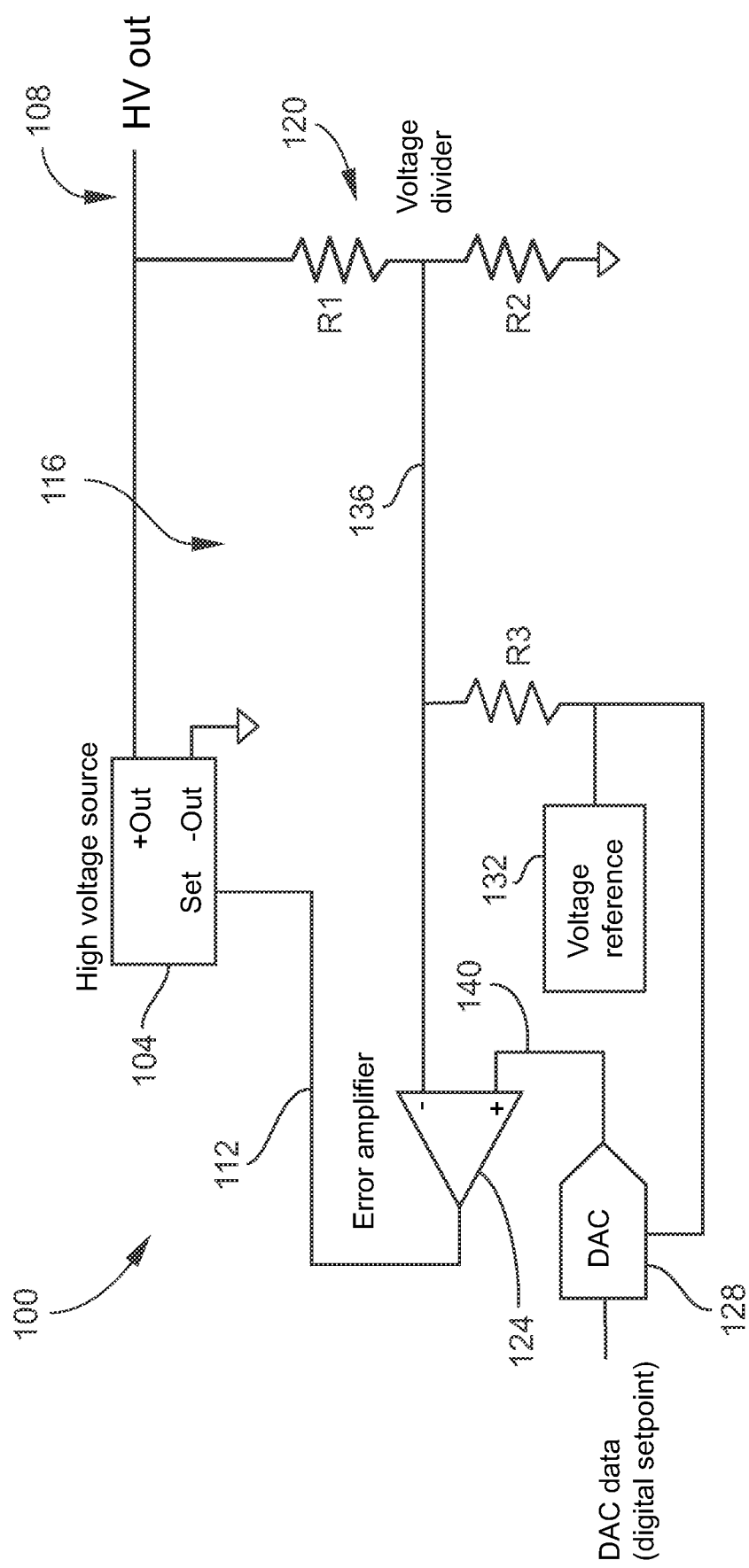
FIG. 1 is a schematic view of a typical precision high-voltage (HV) power supply of known configuration.

FIG. 1 is a schematic view of a typical precision high-voltage (HV) power supply 100 of known configuration. The HV power supply 100 includes an HV source 104 that supplies high voltage (a direct current (DC) output voltage of high magnitude, e.g. 1 kV or greater) to the terminals of an HV output 108, which may be connected to an instrument requiring the HV power for its operation. The HV power supply 100 has a control signal input ("Set"), and is configured (i.e., through its circuitry and hardware) to output the output voltage at a level set by a control signal 112 received at the control signal input. Depending on the configuration, the control signal 112 may be derived directly from a user-operated setting or from other circuitry (not shown) communicating with the control signal input.

To assist in maintaining the output voltage at the desired set-point level (and ideally with a desired level of precision or error tolerance), the HV power supply 100 further includes a single, analog feedback loop 116 connected between the HV source 104 and the HV output 108. The feedback loop 116 includes a voltage divider 120 (represented as two resistances R1 and R2), an error amplifier 124, a digital-to-analog converter (DAC) 128, and a voltage reference 132. The voltage divider 120 is configured to divide the output voltage seen at the HV output 108 down to a proportionally attenuated level (e.g., several orders of magnitude lower than the output voltage) that can be safely utilized as a low-voltage measurement signal 136 by the feedback circuitry. The measurement signal 136 representing the output voltage is fed to the inverting input (−) of the error amplifier 124. The voltage reference 132, typically a small integrated circuit (IC) connected to a power supply (not shown), is configured to output a stable DC reference voltage (e.g., 5 V DC) as appreciated by persons skilled in the art. The voltage reference 132 may be coupled to the inverting input of the error amplifier 124 (optionally via a resistance R3) and to the DAC 128. In the illustrated example, the set-point corresponding to the desired level of the output voltage supplied by the HV power supply 100 is a digital set-point signal, or DAC data signal, fed to the input of the DAC 128. The DAC 128 converts the digital set-point signal to an analog set-point signal 140, and outputs the analog set-point signal 140 to the non-inverting input (+) of the error amplifier 124. The error amplifier 124 compares measurement signal 136 received from the voltage divider 120 to the set-point signal 140, and outputs an error signal based on the difference between the measurement signal 136 and the set-point signal 140. In the illustrated example, this error signal is utilized as the control signal 112 that is provided to the control signal input of the HV source 104. The internal control circuitry of the HV source 104 utilizes the control signal 112 to determine the amount of adjustment the HV source 104 needs to make to the output voltage, so that the output voltage supplied to the HV output 108 closely matches (i.e., approximates with a certain degree of precision) the desired set-point value represented by the digital set-point signal.

As will become evident from the following description, embodiments disclosed herein provide a digital feedback loop with low speed and high precision, which when added to an HV power supply, improves the output voltage precision at direct current (DC) and low frequencies. The digital feedback loop reduces the low frequency noise and drift of the HV power supply, thereby improving the performance of the instrument utilizing the supplied power, for example improving the mass accuracy of time-of-flight (TOF) mass spectrometers. An analog feedback loop (such as described above and illustrated in FIG. 1) is still retained to preserve transient response and mid-frequency noise reduction, while the added digital feedback loop corrects low frequency errors. One aspect of the presently disclosed subject matter relates to the addition of an analog-to-digital converter (ADC) to the HV power supply, which introduces essentially no additional errors of its own to sense DC and low frequency deviations of the output voltage from the desired set-point value. The sensed error is utilized to adjust a control signal that returns or restores the output to the desired voltage.

Figure 2:
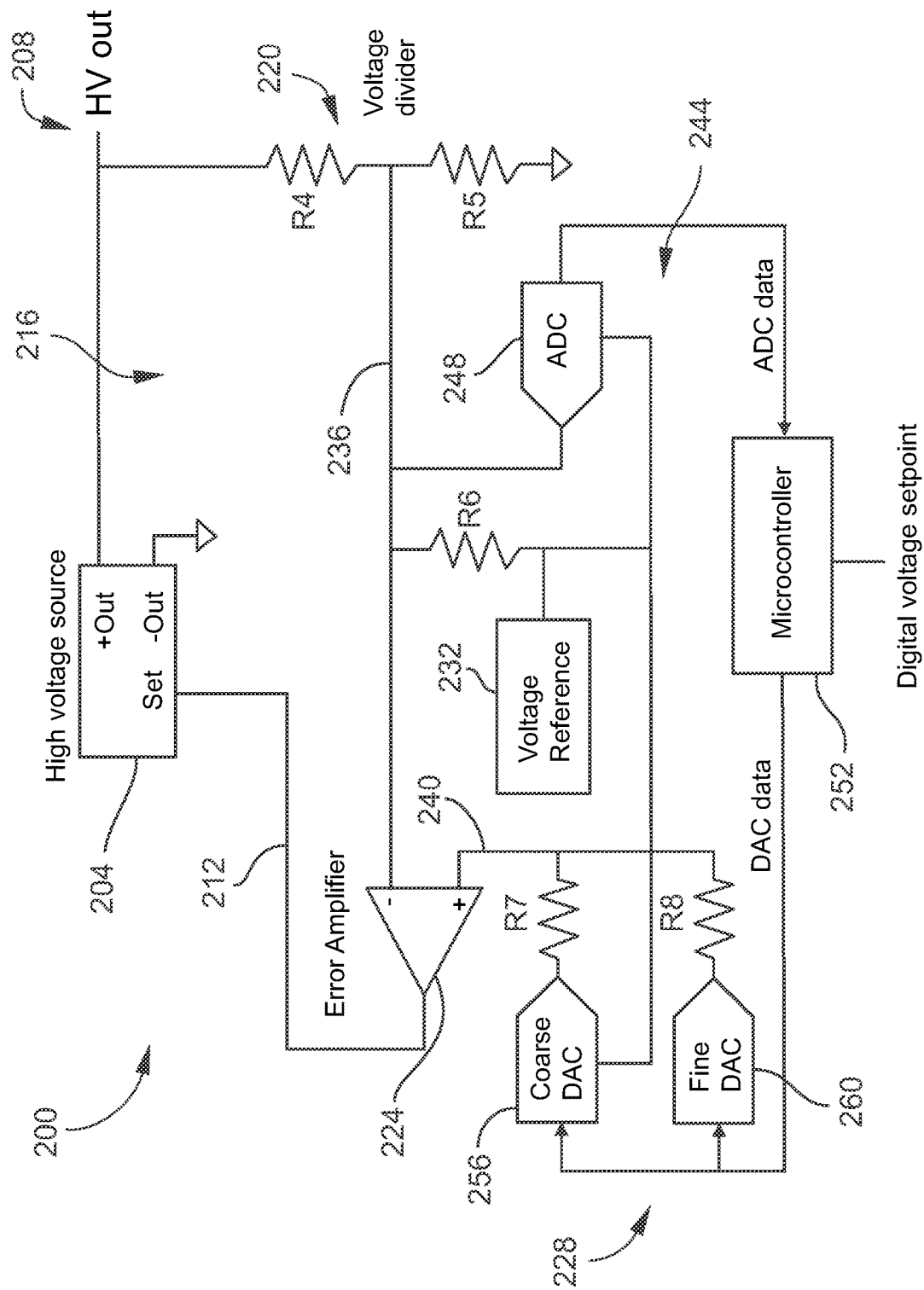
FIG. 2 is a schematic view of an example of an HV power supply according to an embodiment of the present disclosure.

FIG. 2 is a schematic view of an example of a high-voltage (HV) power supply 200 according to an embodiment of the present disclosure. The HV power supply 200 may be characterized as having a dual-loop (digital plus analog feedback loops) HV power supply architecture. As appreciated by persons skilled in the art, some or all of the components schematically depicted in FIG. 2 may be embodied in a suitable physical structure, such as a printed circuit board (PCB) for example.

The HV power supply 200 includes a high-voltage (HV) source 204 configured to supply high voltage (a typically direct current (DC) output voltage of high magnitude, e.g. 1 kV or greater) to the terminals of a high-voltage (HV) output 208, which may be connected to an instrument requiring the HV power for its operation. The HV power supply 200 has an HV source control signal input ("Set"), and is configured (i.e., through its circuitry and hardware) to output the output voltage at a level set by a control signal 212 received at the control signal input. The HV source 204 generally may have any configuration suitable for outputting a high-level output voltage, which often entails amplifying or boosting a low-level voltage supplied to the HV source 204. In one non-exclusive example, the HV source 204 is or includes a DC-to-DC converter, an example of which is described below in conjunction with FIG. 4.

The HV power supply 200 further includes an analog feedback loop 216 connected between the HV source 204 and the HV output 208. The analog feedback loop 216 includes a voltage divider 220 (represented as two resistances R4 and R5), an error amplifier 224, a digital-to-analog converter (DAC) 228, and a voltage reference 232. As noted above, the voltage divider 220 is configured to divide the output voltage seen at the HV output 208 down to a proportionally attenuated measurement signal 236 that is at a low-voltage level compatible with the feedback circuitry. Generally, the voltage divider 220 may have any configuration suitable for the circuitry of the HV power supply 200 such as, for example, a thick-film configuration, thin-film configuration, bulk metal configuration, etc. As the voltage divider 220 is typically potted to withstand high voltage, it may be readily configured for individual temperature regulation. The measurement signal 236 representing the output voltage is fed to a feedback input (or first amplifier input) of the error amplifier 224 for feedback. In the illustrated example, the feedback input of the error amplifier 224 is functionally a negative feedback input in the sense that this input is negative relative to the high-voltage output and is compared to the other input of the error amplifier 224, which is referred to herein as a setting input (or second amplifier input) of the error amplifier 224. The voltage reference 232 is configured to output a stable DC reference voltage (e.g., 5 V DC), and is coupled to the feedback input of the error amplifier 224 (optionally via a resistance R6) and to the DAC 228. The voltage reference 232 is typically a small IC as noted above, which can be thermally isolated from the rest of the circuitry of HV power supply 200 (e.g., from the bulk of the PCB) to enable precise temperature control with minimal power. Providing temperature control of just the voltage divider 220 and the voltage reference 232 may be sufficient to achieve high stability of the HV power supply 200, without needing to provide temperature control of all of the circuitry of the HV power supply 200, due to the stabilizing effect of a digital feedback loop 244 as will now be described.

In addition to the analog feedback loop 216, the HV power supply 200 further includes a digital feedback loop 244 connected between the voltage divider 220 and the DAC 228. The digital feedback loop 244 includes an ADC 248 and a digital (signal) processor 252 (e.g., an electronics-based controller such as a microcontroller). In an embodiment, the ADC 248 exhibits at least 20 bits of resolution. The voltage reference 232 may be coupled to the ADC 248. The ADC 248 is configured to receive the measurement signal 236 outputted by the voltage divider 220, convert the measurement signal 236 to a digital ADC data signal, and output the ADC data signal to the digital processor 252. In the present embodiment, a digital set-point input signal (or digital voltage set-point input) corresponding to the desired level of the output voltage supplied by the HV power supply 200 is inputted to the digital processor 252. The digital set-point signal may be, for example, inputted directly by a user operation or by other circuitry (not shown) communicating with the digital processor 252.

The digital processor 252 is configured to compute, based on the digital set-point input signal and the ADC data signal, the digital DAC data signal required to achieve a desired output voltage output. This DAC data signal is transmitted to the DAC 228. The DAC 228 converts the DAC data signal to an analog DAC output signal 240, and outputs the DAC output signal 240 to the setting input (or second amplifier input) of the error amplifier 224. In the illustrated example, the setting input of the error amplifier 224 is depicted as a non-inverting input (+), but in other examples the setting input may be an inverting input (−). The error amplifier 224 compares measurement signal 236 received from the voltage divider 220 to the DAC output signal 240, and outputs an error signal based on the difference or discrepancy between the measurement signal 236 and the DAC output signal 240. In the present embodiment, this error signal is utilized as the control signal 212 provided to the control signal input of the HV source 204. The internal control circuitry of the HV source 204 utilizes the control signal 212 to determine the amount of adjustment the HV source 204 needs to make to the output voltage, so that the output voltage supplied to the HV output 208 closely matches the desired set-point value represented by the digital set-point signal with a high degree of precision. That is, in this embodiment, the digital processor 252 is configured to calculate a value for the digital DAC data signal effective to set the analog control signal 212 outputted by the error amplifier 224 to a value effective for adjusting the high voltage outputted by the HV source 204 to the digital voltage set-point inputted to the digital processor 252.

In an embodiment, the DAC 228 is a precision DAC that includes a plurality of discrete DAC units exhibiting different scale factors to enhance precision. In the illustrated embodiment, for example, the DAC 228 includes a coarse (resolution) DAC 256 and a fine (resolution) DAC 260, connected between the digital processor 252 and the setting input of the error amplifier 224. By this configuration, the DAC output signal 240 transmitted to the setting input is the sum of a coarse DAC output signal outputted by the coarse DAC 256 and a fine DAC output signal outputted by the fine DAC 260 through respective, differently valued resistances R7 and R8. In an embodiment, the coarse DAC 256 covers the entire output range of the HV source 204 with limited resolution, while the fine DAC 260 provides high resolution to adjust the output to values between the steps of the coarse DAC 256. In an embodiment, the precision DAC 228 (including the pair of DACs 256 and 260) is utilized with an ADC 248 having a stability and noise level comparable to or better than the precision DAC 228. For example, 24-bit ADCs using the sigma-delta conversion technique are now available that interleave calibration cycles between the input conversion cycles, essentially eliminating internal drift and low frequency noise. Conversion rates of these ADCs are presently limited to about 10 conversions per second. Within the bandwidth of the digital feedback loop 244, noise and drift that are generated in the DACs 256 and 260, error amplifier 224, and other control circuitry are detected by the ADC 248 and suppressed by adjustments to the DAC settings. Thus, in an embodiment, the ADC 248 is configured to interleave calibration cycles between input conversion cycles (or HV input readings) to correct for variations in offset and scale factor. As appreciated by persons skilled in the art, a calibration cycle consists of a measurement of the offset voltage by shorting the input terminals together combined with a measurement of a known reference voltage. The ADC 248 adjusts its offset and scale factors to make the two readings equal to their known values.

In an embodiment, the DAC 228 exhibits at least 20 bits of resolution. Even with a stable 24-bit DAC, there would still be an advantage, in some embodiments, to using a pair of DACs 256 and 260 in this application. For example, the high-voltage power supplies in time-of-flight (TOF) mass spectrometers are generally held at a constant voltage for extended periods of time. This allows the coarse resolution DAC (e.g., coarse DAC 256) to remain at a fixed setting, while the high-resolution fine DAC (e.g., fine DAC 260) is adjusted as required to hold the output constant. In an embodiment, the fine DAC 260 may have a full-scale output range that overlaps the least significant bit (LSB) of the output of the coarse DAC 256. The least significant bit (LSB) of the fine DAC 260 is small enough that a step of a one LSB will not be objectionable during normal operation, while its total range is large enough to compensate for all of the drift that can occur at a fixed voltage setting. As long as there is enough overlap between the full scale range of the fine DAC 260 and the LSB of the coarse DAC 256, each DAC 256 and 260 needs only enough linearity to ensure its own monotonicity. This is much easier to achieve than monotonicity over the full range of a DAC with 20 bits of resolution or more. All DACs also exhibit some transient noise feedthrough to the analog output when their digital set-point is changed. This is not a problem for the coarse DAC 256, which remains fixed during operation, and the output of the fine DAC 260 is attenuated enough that such noise feedthrough is negligible.

The high DC loop gain that results from the high resolution of the ADC 248 also minimizes errors from other sources. If the input voltage to the HV source 204 changes, any corresponding change in its output voltage will be corrected down to the resolution of the ADC 248. Similarly, if the load current drawn from the HV output 208 (e.g., by an instrument being supplied the power) changes, the output voltage will be held constant. Getting enough loop gain for this level of performance from power supplies of the prior art, such as the configuration shown in FIG. 1, would be very difficult if possible at all.

In an embodiment, the ADC 248 has a resolution of 20 bits or greater. In various embodiments, the ADC 248 has a resolution of 21, 22, 23, 24, 25, 26, 27, 28, 29, 30, 31, or 32 bits. In an embodiment, the DAC 228 has a resolution of 20 bits or greater. In various embodiments, the DAC 228 has a resolution of 21, 22, 23, 24, 25, 26, 27, 28, 29, 30, 31, or 32 bits.

Figure 3:
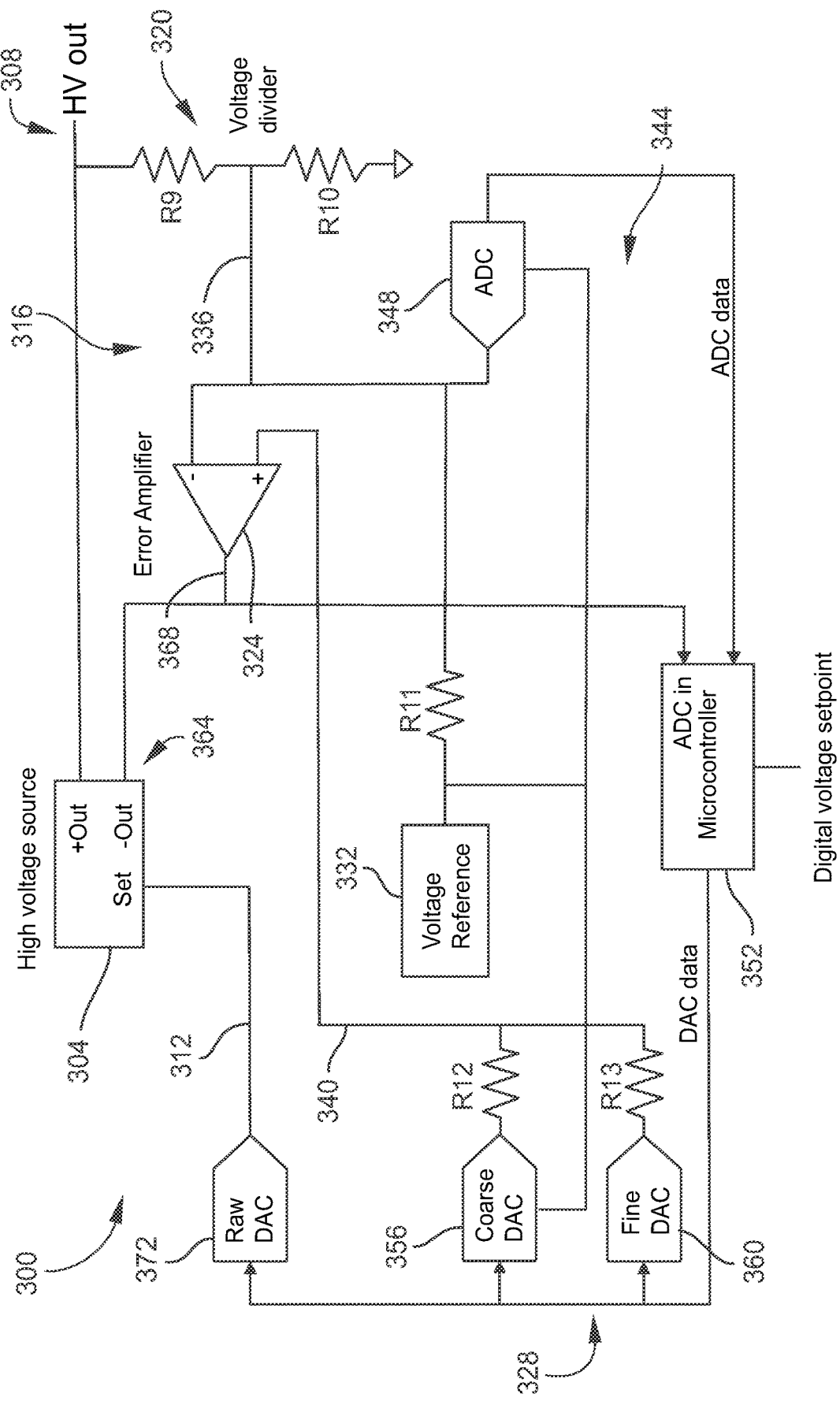
FIG. 3 is a schematic view of an example of an HV power supply according to another embodiment of the present disclosure.

FIG. 3 is a schematic view of an example of an HV power supply 300 according to another embodiment of the present disclosure. The HV power supply 300 combines, in a complementary manner, the DC and low-frequency performance advantages provided by the dual-loop HV power supply architecture of embodiments described herein (e.g., the HV power supply 200 illustrated in FIG. 2) with the high-frequency advantages provided by a fast low-side analog feedback architecture. An example of the low-side analog feedback configuration is described in U.S. Pat. No. 10,872,753, which is incorporated by reference herein in its entirety. By combining features from both the dual-loop HV power supply architecture and the low-side analog feedback architecture, the HV power supply 300 may produce a high-voltage power supply of exceptional performance over a wide bandwidth ranging from, for example, DC to 100 kHz or greater.

The HV power supply 300 includes an HV source 304 configured to supply a high-level output voltage, set by a control signal 312 received at an HV source control signal input ("Set") of the HV source 304, at an HV output 308 as described above. The HV power supply 300 further includes an analog feedback loop 316 connected between the HV source 304 and the HV output 308. The analog feedback loop 316 includes a voltage divider 320 (represented by two resistances R9 and R10), an error amplifier 324, a first DAC 328, and a voltage reference 332 as described above. The HV power supply 300 further includes a digital feedback loop 344 connected between the voltage divider 320 and the first DAC 328. The digital feedback loop 344 includes an ADC 348 and a digital (signal) processor 352 as described above. The voltage reference 332 may be coupled to a feedback input (or first amplifier input) of the error amplifier 324 and the ADC 348 (optionally through a resistance R11), and to the first DAC 328. In the illustrated example, the feedback input of the error amplifier 324 is depicted as an inverting input (−), but in other examples the feedback input may be a non-inverting input (+). Also, the error amplifier 324 includes a setting input (or second amplifier input), which in the illustrated example is depicted as a non-inverting input (+) but in other examples may be an inverting input (−). The voltage divider 320 divides the output voltage received at the HV output 308 down to a proportionally attenuated measurement signal 336, which is transmitted to both the feedback input of the error amplifier 324 and to the ADC 348 as described above. The ADC 348 is configured to receive the measurement signal 336 outputted by the voltage divider 320, convert the measurement signal 336 to a digital ADC data signal, and output the ADC data signal to the digital processor 352. A digital set-point signal corresponding to the desired level of the output voltage supplied by the HV power supply 300 is inputted to the digital processor 352.

The error amplifier 324 is configured to produce an amplifier output signal (or error signal) 368 based on the signals received at its feedback input and setting input. However, unlike the embodiment described above in conjunction with FIG. 2, the amplifier output signal 368 outputted from the error amplifier 324 is not utilized directly as the control signal 312 that primarily drives the set-point of the output voltage. Instead, the output of the error amplifier 324 is coupled to a return side 364 of the output of the HV source 304, and the amplifier output signal 368 is transmitted to an input of the digital processor 352 communicating with an internal (e.g., 12-bit) ADC of the digital processor 352. Thus, in this embodiment, the digital processor 352 is configured to compute a first digital DAC data signal based on the ADC data signal received from the ADC 348, the amplifier output signal 368 received from the error amplifier 324 (and digitized by the internal ADC of the digital processor 352), and the digital voltage set-point input. This first DAC data signal is transmitted to the first DAC 328. The first DAC 328 converts the first DAC data signal to an analog DAC output signal 340, and outputs the DAC output signal 340 to the setting input of the error amplifier 324. As in the embodiment described above in conjunction with FIG. 2, the first DAC 328 may be a precision DAC that includes two or more DAC units providing different resolutions, such a coarse (resolution) DAC 356 and a fine (resolution) DAC 360 connected to the setting input of the error amplifier 324 through different resistances R12 and R13, respectively. The error amplifier 324 compares measurement signal 336 received from the voltage divider 320 to the DAC output signal 340, and outputs the amplifier output signal 368 based on the difference or discrepancy between the measurement signal 336 and the DAC output signal 340.

Unlike the embodiment described above in conjunction with FIG. 2, the HV power supply 300 also includes a second DAC 372, also referred to herein as a raw DAC. In addition to the first digital DAC data signal noted above, the digital processor 352 is configured to compute a second digital DAC data signal based on the ADC data signal received from the ADC 348, the amplifier output signal 368 received from the error amplifier 324 (and digitized by the internal ADC of the digital processor 352), and the digital voltage set-point input. This second DAC data signal is transmitted to the second DAC 372. Thus, the second DAC 372 is configured to receive the second digital DAC data signal from the digital processor 352. In the present embodiment, the second DAC 372 converts the second digital DAC data signal to the control signal 312, and outputs the control signal 312 to the HV source control input of the HV source 304. Thus, in the present embodiment, the magnitude of the differential output voltage between the +OUT and −OUT terminals of the HV source 304 is set by the control signal 312 outputted by the second DAC 372. The final output voltage at the HV output 308 is the sum of the differential output voltage of the HV source 304 and the amplifier output signal 368 seen at the return side 364 of the HV source 304.

The first and second DAC data signals produced by the digital processor 352 may be transmitted to the respective first and second DACs 328 and 372 in any suitable manner (e.g., by any suitable structure). As one non-exclusive example, the "DAC data" line illustrated in FIG. 3 represents a data bus configured to carry the first and second DAC data signals distinctly. Such data bus is appropriately coupled to the first and second DACs 328 and 372 so that the first DAC 328 is selected to receive the first DAC data signal and, independently, the second DAC 372 is selected to receive the second DAC data signal, as appreciated by persons skilled in the art.

In the example illustrated in FIG. 3, the digital processor 352 is described as including an internal ADC that converts the analog amplifier output signal 368 received from the error amplifier 324 to a digital signal for further processing by the digital processor 352. In this case, the ADC 348 that is configured to receive the measurement signal 336 from the voltage divider 320 may be referred to as a first ADC, and the internal ADC that configured to receive the amplifier output control signal 368 from the error amplifier 324 may be referred to as a second ADC. It will be understood, however, that the second ADC may be either an internal ADC (i.e., internal to the digital processor 352) as illustrated by example in FIG. 3, or alternatively an external ADC (i.e., external to the digital processor 352, similar to the illustrated ADC 348). That is, in one embodiment (as illustrated), the digital processor 352 is configured to digitize the amplifier output control signal 368 received from the error amplifier 324 by way of an internal, second ADC integrated with the digital processor 352. In another embodiment, the HV power supply 300 includes an external, second ADC configured to receive the amplifier output control signal 368 from the error amplifier 324, convert the amplifier output control signal 368 to a digitized amplifier output control signal 368, and transmit the digitized amplifier output control signal 368 to the digital processor 352.

Figure 4:
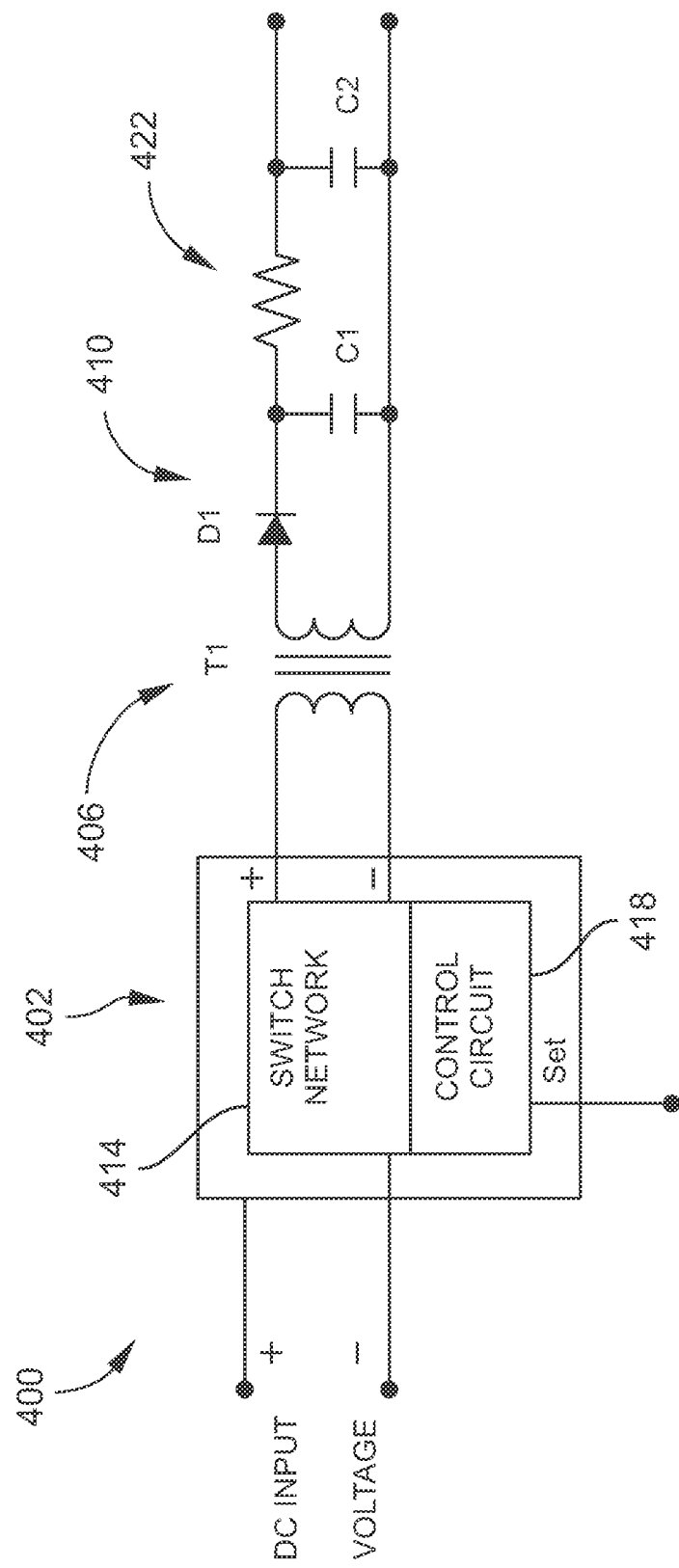
FIG. 4 is a schematic view of an example of a DC-to-DC converter that may be provided as, or as a part of, an HV power supply according to an embodiment of the present disclosure.

FIG. 4 is a schematic view of an example of a DC-to-DC converter 400 that may be provided as, or as a part of, an HV power supply (e.g., the HV power supply 200 or 300 of FIG. 2 or 3, respectively) according to an embodiment of the present disclosure. Generally, the DC-to-DC converter 400 is configured to receive a low DC voltage from a low DC voltage input and boost the low DC voltage to a high DC voltage provided at an HV output (e.g., the HV output 208 or 308 of FIG. 2 or 3, respectively). Also, the DC-to-DC converter 400 may be configured to maintain the high-voltage output and the low DC voltage input in DC isolation from each other.

For these purposes, the DC-to-DC converter 400 may include a switching circuit 402 configured to convert the low DC voltage to an alternating current (AC) voltage, a boost circuit 406 configured to boost the AC voltage to a boosted AC voltage, and a rectifier circuit 410 configured to convert the boosted AC voltage to the high DC voltage. The switching circuit 402 may include a switch network 414 configured to receive the low DC voltage input and a control circuit 418 configured to receive a control signal (e.g., the control signal 212 or 312 of FIG. 2 or 3, respectively) at a control signal input ("Set"). The switch network 414 may include a network of switches (typically transistors) configured to perform DC-to-AC conversion. The control circuit 418 is configured to control the operation of the switches based on the control signal received. For example, the control circuit 418 may vary the timing of the switches or the voltage or current applied to the switches, as appreciated by persons skilled in the art. The boost circuit 406, schematically represented by a single transformer T1 with primary and secondary windings, may include one or more transformers and/or inductors for boosting the AC voltage received from the switch network 414. The rectifier circuit 410, schematically represented by a single diode D1 and capacitor C1, may include a network of diodes and capacitors configured to perform AC-to-DC conversion (rectification). Optionally, the DC-to-DC converter 400 may further include (or communicate with) an output filter circuit 422. The output filter circuit 422, schematically represented by a single resistor R14 and capacitor C2, may include a network of resistors and capacitors configured to reduce ripple voltage in the output voltage.

An example of a DC-to-DC converter is further described in above-referenced U.S. Pat. No. 10,872,753.

Figure 5:
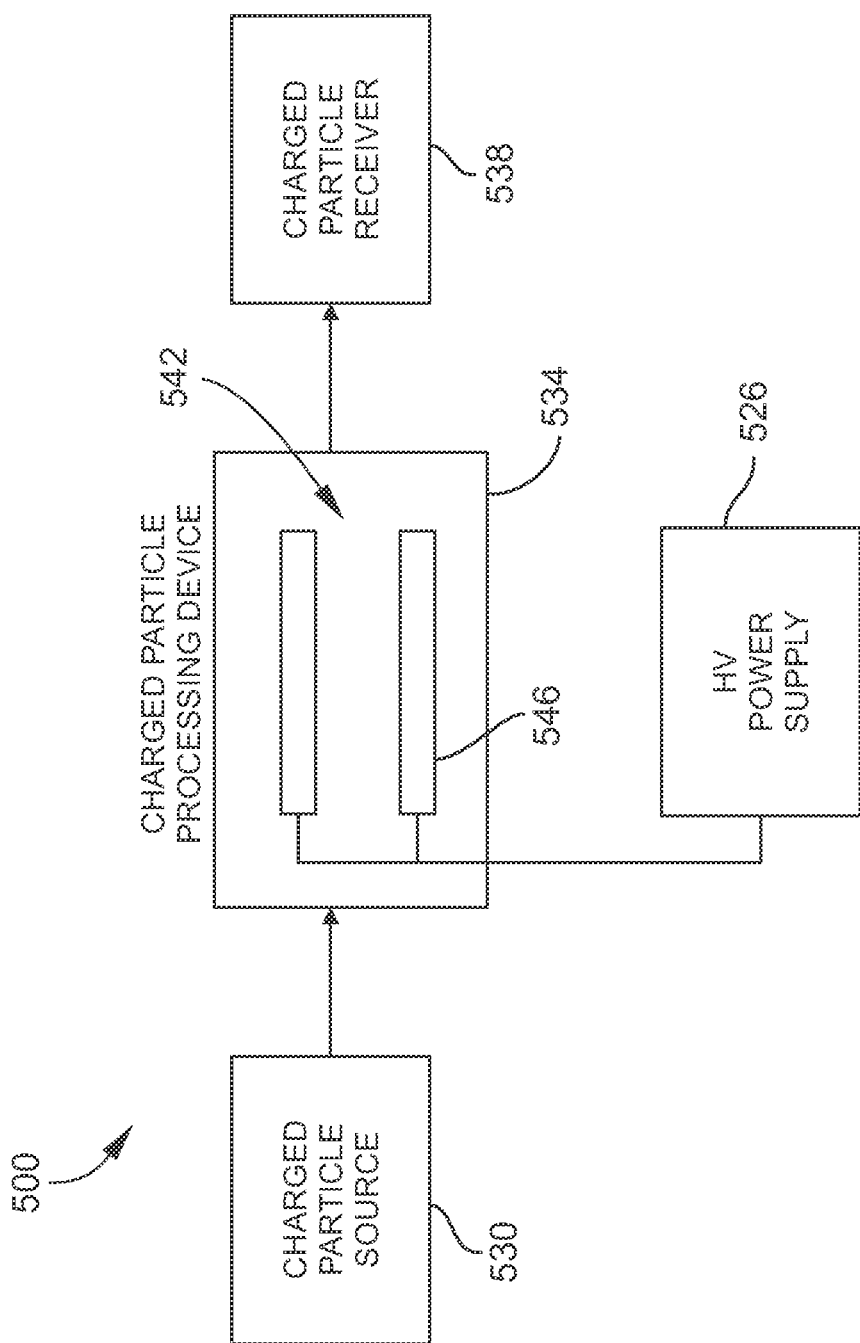
FIG. 5 is a schematic view of an example of a charged particle processing apparatus (or device, instrument, system, etc.) in which an HV power supply as disclosed herein may be provided.

FIG. 5 is a schematic view of an example of a charged particle processing apparatus (or device, instrument, system, etc.) 500 in which an HV power supply 526 as disclosed herein may be provided. The HV power supply 526 may, for example, correspond to the HV power supply 200 or 300 of FIG. 2 or 3, respectively. Generally, the charged particle processing apparatus 500 may be any apparatus that requires high-precision, high-magnitude (typically DC) electrical power for its operation. As one non-exclusive example, the charged particle processing apparatus 500 may be a mass spectrometer, particularly a TOF mass spectrometer in which the HV power supply 526 may be utilized to provide power to accelerate, deflect, and/or focus ions in the flight tube of the TOF mass spectrometer. Instead of a TOF analyzer, the mass spectrometer may include a quadrupole mass analyzer or any other type of ion analyzer. As another non-exclusive example, the charged particle processing apparatus 500 may be an electron microscope such as a transmission electron microscope (TEM) or scanning electron microscope (SEM). As used herein, the term "charged particle" refers to an ion or an electron, depending on the type of charged particle processing apparatus 500 as appreciated by persons skilled in the art.

In addition to the HV power supply 526, the charged particle processing apparatus 500 may include a charged particle source 530, a charged particle processing device 534, and a charged particle receiver 538. The charged particle source 530 may, for example, include components configured to produce (e.g., ionize, emit, etc.) charged particles (e.g., via ionization of a substance, emission from a material, etc.) and/or focus charged particles into a beam and/or transmit (a beam of) charged particles to the charged particle processing device 534. Examples of a charged particle source 530 include, but are not limited to, an ion source, ion analyzer, or other type of ion processing device (e.g., mass filter, mass analyzer, ion mobility cell, etc.), an electron source (e.g., an electron emitter such as a thermionic cathode or filament, electron gun, etc.), etc. The charged particle processing device 534 may, for example, be configured for transporting or guiding charged particles, and/or for performing other types of processing of charged particles such as, for example, charged particle beam production, beam steering, acceleration, cooling, filtering, analyzing, detecting, measuring, imaging, etc. For such purposes, in some embodiments, the charged particle processing device 534 may include a chamber 542 that receives or contains charged particles, and one or more electrodes 546 configured to receive power from the HV power supply 526. In such case, the charged particle processing device 534 generally may be configured to apply the high voltage outputted by the HV power supply 526 to the electrode(s) 546 to generate an electric field to which the charged particles in the chamber 542 are exposed. Examples of a charged particle receiver 538 include, but are not limited to, an ion analyzer (e.g., mass filter, mass analyzer, TOF analyzer, ion mobility cell, etc.), a sample to be irradiated or imaged, a sample holder or sample stage, a charged particle detector (e.g., ion detector, electron detector, imaging device, etc.), an electron collector, trap or anode, etc. As appreciated by persons skilled in the art, depending on the embodiment, the charged particle processing apparatus 500 may further include one or more intermediate components (not shown) positioned between the charged particle source 530 and the charged particle processing device 534, and/or between the charged particle processing device 534 and the charged particle receiver 538, such as charged particle optics, as needed for processing or transporting the charged particles.

The present disclosure further encompasses methods for mass analysis and microscopy that utilize a charged particle processing apparatus 500 as described herein.

Exemplary Embodiments

Exemplary embodiments provided in accordance with the presently disclosed subject matter include, but are not limited to, the following:

1. A high-voltage (HV) power supply, comprising: a high-voltage output; a high-voltage source comprising a control signal input, and configured to output an output voltage at the high-voltage output based on a control signal received at the control signal input; a voltage divider configured to produce a measurement signal proportionally attenuated from the output voltage; an error amplifier comprising a feedback input, a setting input, and an amplifier output, wherein the error amplifier is configured to receive the measurement signal from the voltage divider at the feedback input, receive a digital-to-analog converter (DAC) output signal at the setting input, produce the control signal based on the measurement voltage signal and the DAC output signal, and output the control signal from the amplifier output to the control signal input; an analog-to-digital converter (ADC) configured to receive the measurement signal from the voltage divider, convert the measurement signal to an ADC data signal, and output the ADC data signal; a digital processor configured to receive the ADC data signal from the ADC, receive a digital set-point input signal, and produce a digital DAC data signal based on the ADC data signal and the digital set-point input signal, wherein the digital set-point input signal corresponds to a set-point voltage value of the output voltage desired to be outputted at the high-voltage output; and a digital-to-analog converter (DAC) configured to receive the digital DAC data signal from the digital processor, convert the digital DAC data signal to an analog DAC output signal, and output the DAC output signal to the setting input, wherein the digital processor is configured to calculate a value for the digital DAC data signal effective to set the control signal outputted by the error amplifier to a value effective for adjusting the output voltage outputted by the high-voltage source to the set-point voltage value.

2. The HV power supply of embodiment 1, wherein the high-voltage source is configured to output the high voltage at a magnitude in a range from 1 kV or greater.

3. The HV power supply of any of the preceding embodiments, wherein the output voltage is a direct current (DC) output voltage, and the high-voltage source comprises a DC-to-DC converter configured to receive a low DC voltage from a low DC voltage input and boost the low DC voltage to the output DC voltage of higher magnitude than the low DC voltage.

4. The HV power supply of embodiment 3, wherein the DC-to-DC converter comprises a switching circuit configured to convert the low DC voltage to an alternating current (AC) voltage, a boost circuit configured to boost the AC voltage to a boosted AC voltage, and a rectifier circuit configured to convert the boosted AC voltage to the output DC voltage.

5. The HV power supply of embodiment 4, wherein the switching circuit comprises a network of transistors.

6. The HV power supply of embodiment 4 or 5, wherein the boost circuit comprises a transformer.

7. The HV power supply of any of embodiments 4-6, wherein the rectifier circuit comprises a network of diodes and capacitors.

8. The HV power supply of any of embodiments 3-7, wherein the DC-to-DC converter is configured to maintain the high-voltage output and the low DC voltage input in DC isolation from each other.

9. The HV power supply of any of the preceding embodiments, wherein the ADC has a resolution of 20 bits or greater.

10. The HV power supply of any of the preceding embodiments, wherein the ADC is configured to interleave calibration cycles between input conversion cycles to correct for variations in offset and scale factor.

11. The HV power supply of any of the preceding embodiments, wherein the DAC has a resolution of 20 bits or greater.

12. The HV power supply of any of the preceding embodiments, wherein: the DAC comprises a coarse DAC and a fine DAC connected between the digital processor and the setting input; and the DAC output signal outputted to the setting input is a sum of a coarse DAC output signal outputted by the coarse DAC and a fine DAC output signal outputted by the fine DAC.

13. The HV power supply of embodiment 12, wherein the fine DAC has a full-scale output range that overlaps a least significant bit (LSB) of an output of the coarse DAC.

14. A high-voltage (HV) power supply, comprising: a high-voltage output; a high-voltage source comprising a control signal input, and a return side communicating with the high-voltage output, wherein the high-voltage source is configured to output an output voltage as measured from the return side to the high-voltage output based on a control signal received at the control signal input and an amplifier output signal received at the return side; a voltage divider configured to produce a measurement signal proportionally attenuated from the output voltage; an error amplifier comprising a feedback input, a setting input, and an amplifier output, wherein the error amplifier is configured to receive the measurement signal from the voltage divider at the feedback input, receive a digital-to-analog converter (DAC) output signal at the setting input, produce the amplifier output signal based on the measurement signal and the DAC output signal, and output the amplifier output signal from the amplifier output to the return side; an analog-to-digital converter (ADC) configured to receive the measurement signal from the voltage divider, convert the measurement signal to an ADC data signal, and output the ADC data signal; a digital processor configured to receive the ADC data signal from the ADC, receive the amplifier output signal from the error amplifier, receive a digital set-point input signal, and produce a first digital DAC data signal and a second digital DAC data signal based on the ADC data signal, the amplifier output signal, and the digital set-point input signal, wherein the digital set-point input signal corresponds to a set-point voltage value of the output voltage desired to be outputted at the high-voltage output; a first digital-to-analog converter (DAC) configured to receive the first digital DAC data signal from the digital processor, convert the first digital DAC data signal to an analog DAC output signal, and output the DAC output signal to the setting input; and a second digital-to-analog converter (DAC) configured to receive the second digital DAC data signal from the digital processor, convert the second digital DAC data signal to the control signal, and output the control signal to the control signal input, wherein the digital processor is configured to calculate respective values for the first digital DAC data signal and the second digital DAC data signal effective to set the amplifier output signal to a value effective for adjusting the output voltage outputted by the high-voltage source to the digital voltage set-point inputted to the set-point voltage value.

15. The HV power supply of embodiment 14, wherein the digital processor is configured to digitize the amplifier output control signal received from the error amplifier.

16. The HV power supply of embodiment 14, wherein the ADC configured to receive the measurement signal from the voltage divider is a first ADC, and further comprising a second ADC, wherein the second ADC is configured to receive the amplifier output control signal from the error amplifier, convert the amplifier output control signal to a digitized amplifier output control signal, and transmit the digitized amplifier output control signal to the digital processor.

17. The HV power supply of any of embodiments 14-16, wherein: the first DAC comprises a coarse DAC and a fine DAC connected between the digital processor and the setting input; and the DAC output signal outputted to the setting input is a sum of a coarse DAC output signal outputted by the coarse DAC and a fine DAC output signal outputted by the fine DAC.

18. The HV power supply of embodiment 17, wherein the fine DAC has a full-scale output range that overlaps a least significant bit (LSB) of an output of the coarse DAC.

19. The HV power supply of any of embodiments 14-18, comprising one or more features of any of embodiments 2-11.

20. A charged particle processing apparatus, comprising: the HV power supply of any of the embodiments 1-19; and a charged particle processing device comprising an electrode and a chamber for containing charged particles, wherein the charged particle processing device is configured to apply the high voltage outputted by the HV power supply to the electrode to generate an electric field to which the charged particles in the chamber are exposed.

21. The charged particle processing apparatus of embodiment 20, configured according to one of: the charged particle processing device is part of a mass spectrometer; the charged particle processing device is part of an electron microscope.

22. The charged particle processing apparatus of embodiment 20 or 21, comprising at least one of: a charged particle source configured to supply charged particles to the charged particle processing device; a charged particle receiver configured to receive charged particles from the charged particle processing device.

23. A method for supplying a high voltage, the method comprising: outputting an output voltage from a high-voltage source based on a control signal received by the high-voltage source; producing a measurement signal proportionally attenuated from the output voltage; transmitting the measurement signal to a feedback input of an error amplifier, and to an analog-to-digital converter (ADC); in the ADC, converting the measurement signal to an ADC data signal, and transmitting the ADC data signal to a digital processor; in the digital processor, receiving a digital set-point input signal corresponding to a set-point voltage value of the output voltage desired to be outputted from the high-voltage source, producing a digital DAC data signal based on the ADC data signal and the digital set-point input signal, and transmitting the digital DAC data signal to a digital-to-analog converter (DAC); in the DAC, converting the digital DAC data signal to an analog DAC output signal, and transmitting the DAC output signal to a setting input of the error amplifier; and in the error amplifier, producing the control signal based on the measurement signal and the analog DAC output signal, and transmitting the control signal to the high-voltage source, wherein the digital processor calculates a value for the digital DAC data signal effective to set the control signal produced by the error amplifier to a value effective for adjusting the output voltage outputted by the high-voltage source to the set-point voltage value.

24. The method of embodiment 23, wherein the output voltage is a direct current (DC) output voltage, and further comprising operating the high-voltage source to convert a low DC voltage to an alternating current (AC) voltage, boost the AC voltage to a boosted AC voltage, and convert the boosted AC voltage to the DC output voltage of higher magnitude than the low DC voltage.

25. The method of embodiment 23 or 24, comprising one or more features of any of embodiments 1-22.

26. A method for supplying a high voltage, the method comprising: outputting an output voltage from a high-voltage source based on a control signal received by the high-voltage source; producing a measurement signal proportionally attenuated from the output voltage; transmitting the measurement signal to a feedback input of an error amplifier, and to an analog-to-digital converter (ADC); in the ADC, converting the measurement signal to an ADC data signal, and transmitting the ADC data signal to a digital processor;
in the digital processor: receiving a digital set-point input signal corresponding to a set-point voltage value of the output voltage desired to be outputted from the high-voltage source; receiving an amplifier output signal from the error amplifier; producing a first digital DAC data signal and a second digital DAC data signal based on the ADC data signal, the digital set-point input signal, and the amplifier output signal; transmitting the first digital DAC data signal to a first digital-to-analog converter (DAC); and transmitting the second digital DAC data signal to a second digital-to-analog converter (DAC);
in the first DAC, converting the first digital DAC data signal to an analog DAC output signal, and transmitting the DAC output signal to a setting input of the error amplifier; in the error amplifier, producing the amplifier output signal based on the measurement signal and the analog DAC output signal; and in the second DAC, converting the second digital DAC data signal to the control signal, and transmitting the control signal to the high-voltage source, wherein the digital processor calculates respective values for the first digital DAC data signal and the second digital DAC data signal effective to set the amplifier output signal to a value effective for adjusting the output voltage outputted by the high-voltage source to the digital voltage set-point inputted to the set-point voltage value.

27. The method of embodiment 26, wherein the output voltage is a direct current (DC) output voltage, and further comprising operating the high-voltage source to convert a low DC voltage to an alternating current (AC) voltage, boost the AC voltage to a boosted AC voltage, and convert the boosted AC voltage to the DC output voltage of higher magnitude than the low DC voltage.

28. The method of embodiment 26 or 27, comprising one or more features of any of embodiments 1-22.

It will be understood that terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A power supply, comprising:
a source comprising a control signal input, and configured to output an output voltage at an output based on a control signal received at the control signal input;
a voltage divider configured to produce a measurement signal proportionally attenuated from the output voltage;
an error amplifier comprising a feedback input, a setting input, and an amplifier output, wherein the error amplifier is configured to receive the measurement signal from the voltage divider at the feedback input, receive a digital-to-analog converter (DAC) output signal at the setting input, produce the control signal based on the measurement signal and the DAC output signal, and output the control signal from the amplifier output to the control signal input; and
a digital processor configured to receive the measurement signal converted to an analog-to-digital converter (ADC) data signal, receive a digital set-point input signal, and produce a digital DAC data signal based on the ADC data signal and the digital set-point input signal, wherein the digital set-point input signal corresponds to a set-point voltage value of the output voltage that is to be outputted at the output.

2. The power supply of claim 1, wherein the source is configured to output the voltage at a magnitude in a range from 1 kV or greater.

3. The power supply of claim 1, wherein the output voltage is a direct current (DC) output voltage, and the source comprises a DC-to-DC converter configured to receive a low DC voltage from a low DC voltage input and boost the low DC voltage to the output DC voltage of higher magnitude than the low DC voltage.

4. The power supply of claim 3, wherein the DC-to-DC converter comprises a switching circuit configured to convert the low DC voltage to an alternating current (AC) voltage, a boost circuit configured to boost the AC voltage to a boosted AC voltage, and a rectifier circuit configured to convert the boosted AC voltage to the output DC voltage.

5. The power supply of claim 4, comprising at least one of:
wherein the switching circuit comprises a network of transistors;
wherein the boost circuit comprises a transformer; or
wherein the rectifier circuit comprises a network of diodes and capacitors.

6. The power supply of claim 3, wherein the DC-to-DC converter is configured to maintain the output and the low DC voltage input in DC isolation from each other.

7. The power supply of claim 1, wherein an ADC that converts the measurement signal to the ADC data signal has a resolution of 20 bits or greater.

8. The power supply of claim 1, wherein an ADC that converts the measurement signal to the ADC data signal is configured to interleave calibration cycles between input conversion cycles to correct for variations in offset and scale factor.

9. The power supply of claim 1, further comprising a digital-to-analog converter (DAC) that has a resolution of 20 bits or greater.

10. The power supply of claim 1, further comprising a digital-to-analog converter (DAC), wherein:
the DAC comprises a coarse DAC and a fine DAC connected between the digital processor and the setting input; and
a DAC output signal outputted to the setting input is a sum of a coarse DAC output signal outputted by the coarse DAC and a fine DAC output signal outputted by the fine DAC.

11. The power supply of claim 10, wherein the fine DAC has a full-scale output range that overlaps a least significant bit (LSB) of an output of the coarse DAC.

12. A power supply, comprising:
a output;
a source comprising a control signal input, and a return side communicating with the output, wherein the source is configured to output an output voltage as measured from the return side to the output based on a control signal received at the control signal input and an amplifier output signal received at the return side;
a voltage divider configured to produce a measurement signal proportionally attenuated from the output voltage;
an error amplifier comprising a feedback input, a setting input, and an amplifier output, wherein the error amplifier is configured to receive the measurement signal from the voltage divider at the feedback input, receive a digital-to-analog converter (DAC) output signal at the setting input, produce the amplifier output signal based on the measurement signal and the DAC output signal, and output the amplifier output signal from the amplifier output to the return side; and
a digital processor configured to receive the measurement signal converted to an analog-to-digital converter (ADC) data signal, receive the amplifier output signal from the error amplifier, receive a digital set-point input signal, and produce a first digital DAC data signal and a second digital DAC data signal based on the ADC data signal, the amplifier output signal, and the digital set-point input signal, wherein the digital set-point input signal corresponds to a set-point voltage value of the output voltage that is to be outputted at the output.

13. The power supply of claim 12, wherein the digital processor is configured to digitize the amplifier output signal received from the error amplifier.

14. The power supply of claim 12, further comprising an ADC that is configured to receive the measurement signal from the voltage divider, wherein the ADC is a first ADC, and further comprising a second ADC,
wherein the second ADC is configured to receive the amplifier output signal from the error amplifier, convert the amplifier output signal to a digitized amplifier output signal, and transmit the digitized amplifier output signal to the digital processor.

15. The power supply of claim 12, wherein:
the first DAC comprises a coarse DAC and a fine DAC connected between the digital processor and the setting input; and
the DAC output signal outputted to the setting input is a sum of a coarse DAC output signal outputted by the coarse DAC and a fine DAC output signal outputted by the fine DAC.

16. The power supply of claim 15, wherein the fine DAC has a full-scale output range that overlaps a least significant bit (LSB) of an output of the coarse DAC.

17. A charged particle processing apparatus, comprising:
the power supply of claim 1; and
a charged particle processing device comprising an electrode and a chamber for containing charged particles,
wherein the charged particle processing device is configured to apply the voltage outputted by the power supply to the electrode to generate an electric field to which the charged particles in the chamber are exposed.

18. A method for supplying a voltage, the method comprising:
outputting an output voltage from a source based on a control signal received by the source;
producing a measurement signal proportionally attenuated from the output voltage;
transmitting the measurement signal to a feedback input of an error amplifier, and to an analog-to-digital converter (ADC);
in the ADC, converting the measurement signal to an ADC data signal, and transmitting the ADC data signal to a digital processor; and
in the digital processor, receiving a digital set-point input signal corresponding to a set-point voltage value of the output voltage that is to be outputted from the source, producing a digital digital-to-analog converter (DAC) data signal based on the ADC data signal and the digital set-point input signal, and transmitting the digital DAC data signal to a DAC.

19. The method of claim 18, wherein the output voltage is a direct current (DC) output voltage, and further comprising operating the source to convert a low DC voltage to an alternating current (AC) voltage, boost the AC voltage to a boosted AC voltage, and convert the boosted AC voltage to the DC output voltage of higher magnitude than the low DC voltage.

20. The method of claim 18, wherein the DAC comprises a coarse DAC and a fine DAC, and a DAC output signal transmitted to a setting input of the error amplifier is a sum of a coarse DAC output signal outputted by the coarse DAC and a fine DAC output signal outputted by the fine DAC.

* * * * *